US009636705B2

(12) United States Patent
Böhm et al.

(10) Patent No.: US 9,636,705 B2
(45) Date of Patent: May 2, 2017

(54) MICROWAVE CURING OF MULTI-LAYER COATINGS

(71) Applicant: TATA STEEL UK LIMITED, London (GB)

(72) Inventors: Sivasambu Böhm, Rotherham (GB); Henagama Liyanage Mallika Böhm, Rotherham (GB); Sreedhara Sarma, Rotherham (GB)

(73) Assignee: TATA STEEL UK LIMITED, London (GB)

(*) Notice: Subject to any disclaimer, the term of this patent is extended or adjusted under 35 U.S.C. 154(b) by 3 days.

(21) Appl. No.: 14/413,654

(22) PCT Filed: Jul. 3, 2013

(86) PCT No.: PCT/EP2013/001952
§ 371 (c)(1),
(2) Date: Jan. 8, 2015

(87) PCT Pub. No.: WO2014/008993
PCT Pub. Date: Jan. 16, 2014

(65) Prior Publication Data
US 2015/0140723 A1 May 21, 2015

(30) Foreign Application Priority Data
Jul. 12, 2012 (EP) .................................. 12005154

(51) Int. Cl.
H01L 21/00 (2006.01)
B05D 3/06 (2006.01)
(Continued)

(52) U.S. Cl.
CPC ............. B05D 3/068 (2013.01); B05D 3/029 (2013.01); B05D 7/14 (2013.01); H01L 31/18 (2013.01);
(Continued)

(58) Field of Classification Search
CPC .................................. H01L 31/18; B05D 3/068
(Continued)

(56) References Cited

U.S. PATENT DOCUMENTS 6,242,041 B1    6/2001   Katoot et al.
6,312,548 B1 *  11/2001  Fathi ................... B29C 65/1425
                                                        156/275.1
(Continued)

FOREIGN PATENT DOCUMENTS

WO          9924174 A1      5/1999
WO       WO 0128771 A1 *    4/2001   ............ B01J 19/126
WO       2008055926 A1      5/2008

OTHER PUBLICATIONS

International Search Report dated Aug. 22, 2013 from International Application PCT/EP2013/001952 to Tata Steel UK Limited filed Jul. 3, 2013.

Primary Examiner — Igwe U Anya
(74) Attorney, Agent, or Firm — Vorys, Sater, Seymour and Pease LLP

(57) ABSTRACT

A method for providing a coated strip, which includes the steps of providing a metal or metal alloy strip, applying one or more coating layers on the metal or metal alloy strip and irradiating one or more of the applied coating layers with electromagnetic radiation, wherein one or more of the applied coating layers includes dielectric particles capable of absorbing microwave radiation and wherein microwave radiation is used to selectively heat one or more of the coating layers containing the dielectric particles to dry and/or cure and/or sinter the coating layer.

18 Claims, 3 Drawing Sheets

Figure 1A:
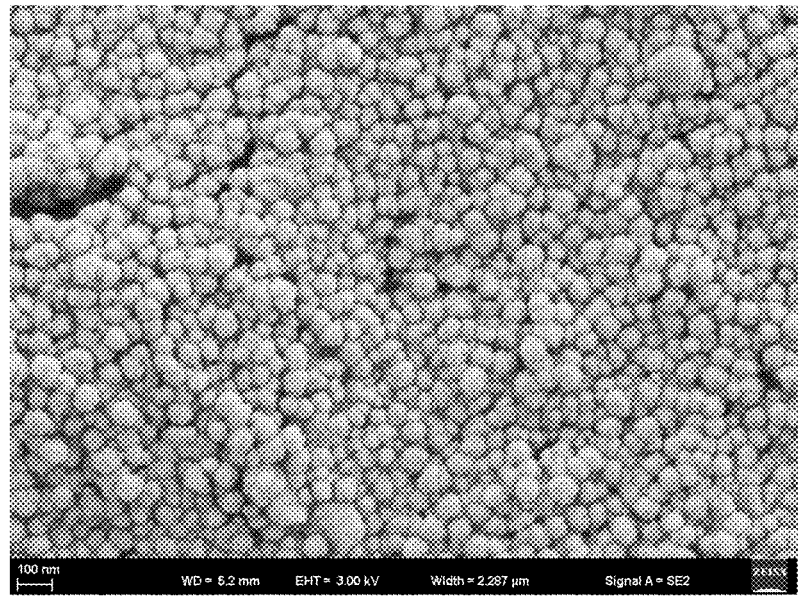

(51) Int. Cl.
  *B05D 3/02* (2006.01)
  *B05D 7/14* (2006.01)
  *H01L 31/18* (2006.01)
  *B05D 7/00* (2006.01)

(52) U.S. Cl.
  CPC .......... *B05D 3/0209* (2013.01); *B05D 3/0254* (2013.01); *B05D 7/52* (2013.01); *B05D 7/56* (2013.01); *B05D 2252/02* (2013.01); *B05D 2601/20* (2013.01)

(58) Field of Classification Search
  USPC .......................................................... 438/85
  See application file for complete search history.

(56) References Cited

U.S. PATENT DOCUMENTS

| | | |
|---|---|---|
| 2003/0224115 A1 | 12/2003 | Guimont |
| 2004/0054044 A1* | 3/2004 | Bittner .................... C09D 5/08 524/261 |
| 2004/0101635 A1* | 5/2004 | Ortlieb ................... B05D 3/147 427/569 |
| 2004/0115477 A1 | 6/2004 | Nesbitt |
| 2004/0253452 A1 | 12/2004 | Ogino |
| 2005/0129859 A1* | 6/2005 | Misev .................... B05D 3/147 427/384 |
| 2006/0051519 A1* | 3/2006 | Dixon ................... B05D 3/0209 427/487 |
| 2006/0217498 A1* | 9/2006 | Kameda .................. C08L 83/04 525/477 |
| 2006/0240177 A1 | 10/2006 | Newkirk et al. |
| 2006/0257575 A1* | 11/2006 | Macor ..................... B05D 3/06 427/372.2 |
| 2009/0176907 A1* | 7/2009 | Subramanian ........... C09D 4/06 522/100 |
| 2010/0009210 A1 | 1/2010 | Kitte et al. |
| 2013/0299953 A1* | 11/2013 | Hubbard ........... H01L 21/02118 257/643 |
| 2013/0302917 A1* | 11/2013 | Ahmad ................. H01L 23/293 438/7 |

* cited by examiner

MICROWAVE CURING OF MULTI-LAYER COATINGS

CROSS-REFERENCE TO RELATED APPLICATIONS

This is a §371 U.S. National Stage Application of International Application No. PCT/EP2013/001952 filed on Jul. 3, 2013, claiming the priority of European Patent Application No. 12005154.5 filed on Jul. 12, 2012.

The present invention relates to a method for providing a coated strip and to the coated strip thus produced.

Coil coating is a continuous process for coating metal or metal alloy strip substrates, typically for subsequent use in the construction and automotive sectors. Such coil coated products are generally known as organic coated strips (OCS).

In the manufacture of OCS, the coil coating process typically comprises the steps of uncoiling a metal strip e.g. aluminium or galvanised steel, and observing the strip for defects. The strip in then cleaned to remove unwanted contaminants before being chemically pre-treated to improve adhesion between the strip and the subsequently applied coating layers. Once the pre-treatment layer is dried, a primer is applied on the pre-treatment layer. The primer is dried and subsequently cured at high temperatures, typically in a convection oven. For OCS products, it is common to apply at least two coats, i.e. the primer and a top coat on the primer, which requires the coated strip to enter the oven for a second time in order to dry and cure the top coat. The coated strip is then cooled, inspected for defects and coiled.

A disadvantage of the above process is that when the coated strip enters the oven for the second time, the previously cured primer layer is subjected to a second heating cycle which may result in the primer layer over heating and exhibiting increased hardness and reduced flexibility. Moreover, subjecting the primer layer to the second heating cycle increases the risk of thermally degrading the primer layer. Although these drawbacks may be overcome through careful selection of the coating components, this places unnecessary limitations on the coating formulation. A further disadvantage relates to the means for drying and curing the primer and the top coat layer. Hot air, infrared (IR) heating, near infrared (NIR) heating or induction heating are commonly used but these means are all energy inefficient, since a large proportion of the energy generated is lost to the surroundings, to the adjacent layers or conducted away via the substrate.

There is therefore a need within the coil coating industry to provide a process which overcomes these disadvantages. There is also a need to provide a process that is more energy efficient.

Coil coating is also being used to manufacture photovoltaic devices on steel strip substrates for roofing and cladding applications. A photovoltaic device is a device which converts light directly into electricity and may be classified according to the nature of the semiconductive material that is used to absorb the light.

The most common photovoltaic devices (solar cells) are those which comprise crystalline silicon (c-Si) as the light absorbing semiconductive material since stable solar cells with good efficiencies are obtained. Organic PV and Dye sensitised solar cells (DSC) have attracted much interest as viable alternatives to C-Si solar cells. An important advantage of Organic PV and DSC is that they are less expensive to manufacture since they comprise low cost materials that can be applied as thin films, often in the nanometer range, using continuous coating techniques.

During the manufacture of DSC a conductive layer is applied on a suitable carrier substrate. For the purposes of coil coating, the conductive layer is typically a conductive organic material that is applied on the carrier substrate and subsequently cured. A thin layer of a porous semi-conductive material is then applied on the conductive layer and the coated substrate is heated between 350° C. and 550° C. to sinter the porous semi-conductive material, typically by circulating air in a convection oven. The sintered porous semi-conductive layer is then sensitised with a photo-active dye capable of absorbing light. An electrolyte is then deposited on the sintered semi-conductive layer, which diffuses into the pores and forms a thin film on the conductive layer.

When the carrier substrate is a metal or a metal alloy, e.g. steel, an insulating layer is typically provided in order to electrically isolate the carrier substrate. The insulating layer also acts as a barrier layer to chemically separate the metal carrier substrate from the electrolyte. If the integrity of the insulating layer is compromised, its ability to electrically and chemically isolate the metal carrier substrate is reduced. The insulating layer may be provided by applying an organic insulating coating on the metal carrier substrate and then curing the insulating coating. The conductive layer and the sintered semiconductive material are then provided on the insulting layer in the manner described above. Due to the nature of the manufacturing route, the insulating layer is heated when the conductive layer is cured and when the semiconductive material is sintered, thereby increasing the risk of thermally degrading the insulating layer and reducing the insulating and barrier properties of the layer.

It is an object of the invention to reduce the number of heating cycles a layer in a multi-layer coating is subjected to during its manufacture.

It is also an object of the invention to provide a more energy efficient method for manufacturing products comprising multi-layer coatings, particularly DSC and OCS products.

One or more of the above objects are satisfied by the present invention, which according to a first aspect defines a method for providing a coated strip, which comprises the steps of providing a metal or metal alloy strip, applying one or more coating layers on the metal or metal alloy strip and irradiating one or more of the applied coating layers with electromagnetic radiation, wherein one or more of the applied coating layers comprise dielectric particles capable of absorbing microwave radiation and wherein microwave radiation is used to selectively heat one or more of the coating layers containing the dielectric particles to dry and/or cure and/or sinter the coating layer.

The method of the invention avoids or at least reduces the disadvantages of the prior art by selectively heating the layer containing the dielectric particles and/or layers already having dielectric properties. This has the advantage that the flexibility and integrity of the previously dried and cured layers is maintained since they are either not heated or heated to a lesser extent. The use of microwaves as a means to selectively heat certain layers also has the advantage that the time needed to dry and/or cure and/or sinter the layer is reduced because heat is supplied directly to the layer to be heated and not to the previously dried and/or cured layers, the substrate or to the surroundings. In this respect the processing time may be reduced by at least 75% relative to conventional heating methods. Since the mechanism of heating is not by conduction through the atmosphere, the integrity of the chamber and its fixtures is also maintained because they are not repetitively heated and cooled in accordance with conventional curing and sintering cycles. The selective heating of certain layers containing dielectric particles or having dielectric properties also has the advantage that the metal or metal alloy is not irradiated with microwave radiation. This is important because metal or metal alloy substrates are known to reflect microwave radiation, which is dangerous to human health. By using microwave radiation to selectively heat certain layers, significant energy savings (>60%) can also be made compared to conventional heating methods e.g. hot air, (IR) heating and (NIR) heating.

In a preferred embodiment at least two coating layers are applied on the metal or metal alloy strip. When the metal or metal alloy strip comprises one coating layer comprising dielectric particles, the method of the invention has the advantage that the reflection of microwave radiation from the metal or metal alloy strip is avoided or at least reduced and that human health is protected. However, when the metal or metal alloy strip comprises at least two coating layers, i.e. a multi-layer coating, the method of the invention has the further advantage that each coating layer can be heated independently. For example, a first coating layer may be provided on the metal or metal alloy strip and heated using conventional heating means to cure the first coating layer. Alternatively, if the first coating layer comprises dielectric particles it may be heated by irradiating the layer with microwave radiation. A second coating layer comprising dielectric particles may then be provided on the cured first coating layer and selectively heated by irradiating the second coating layer with microwave radiation. In this way the physical and mechanical properties of the first coating layer are preserved and reflection of microwave radiation from the metal or metal alloy strip is avoided or at least reduced. Thus, the method of the invention is particularly suitable for heating multi-layer coating systems on metal or metal alloy substrates.

It is preferred that the multi-layer coating comprises at least three layers, preferably between 3 and 7 layers.

In a preferred embodiment at least two coating layers comprise the dielectric particles.

In a preferred embodiment of the invention each applied coating layer is cured and/or sintered before a subsequent coating layer is applied on the cured and/or sintered coating layer.

In a preferred embodiment of the invention one or more of the coating layers contains at least 1 wt % of the dielectric particles. The inventors found that the penetration depth of the microwave radiation could be controlled by varying the dielectric particle content in one or more coating layers, and that by controlling the penetration depth, it is possible to selectively heat and/or cure one or more of the coating layers. For instance, a first coating layer comprising first dielectric particles may be provided on a metal or metal alloy substrate and subsequently cured by irradiating the layer with microwave radiation. A second coating layer containing at least 1 wt % of first or second dielectric particles may then be applied on the cured first coating layer. When irradiated with microwave radiation, it was found that the second coating layer could be cured without substantially heating the first coating layer. This has been attributed to the dielectric particles in the second coating layer absorbing a large proportion of the microwave radiation which prevents or at least reduces absorption of microwave radiation by the first dielectric particles in the first coating layer. The inventors found that a dielectric particle content below 1 wt % did not enable curing of the coating layer containing the dielectric particles. However, by increasing the dielectric particle content in the second coating layer, the selective curing of the second coating layer could be improved. Preferably the dielectric particle content is at least 3 wt % since fast heating rates are obtained. A dielectric particle content of at least 5 wt % is very suitable for this purpose. Preferably the dielectric particle content is between 5 and 80 wt %, more preferably between 5 and 30 wt %, even more preferably between 10 and 15 wt %. Preferably the dielectric particle content is not greater than 80 wt % otherwise such coating layers become difficult to process and result in brittle layers once cured.

In a preferred embodiment a first coating layer adjacent to the strip is dried and/or cured in a convection oven or by using infrared, near infrared or ultraviolet radiation and a second coating layer that is applied on the dried and/or cured first coating layer is cured or sintered using microwave radiation. Such a method is particularly suitable when the first coating layer does not contain dielectric particles.

In a preferred embodiment a fixed microwave frequency selected between 0.9 GHz and 7.0 GHz, preferably between 0.9 and 2.45 GHz is used to selectively cure the coating layers. The use of a fixed microwave frequency between 0.9 and 2.45 GHz is particularly suitable for selectively curing one or more of the coating layers containing the dielectric particles. This has been attributed to the dielectric particles absorbing a large proportion of the microwave radiation within this range.

In a preferred embodiment the dielectric particles comprise carbon black, graphite, carbon nanotubes, iron oxide, titania, silica, zinc oxide or a mixture thereof. These dielectric particles are particularly suitable for absorbing microwave radiation and converting said radiation into heat energy thereby facilitating heating and/or curing and/or sintering of the coating layer. Moreover, each of the aforementioned dielectric particles provides a further function to the coating layer that enhances the performance of the coating layer. For example, the provision of carbon nanotubes in a coating layer increases the conductive properties of that layer, whereas the provision of titania dielectric particles improves the corrosion protection properties and the semi-conductive properties of the layer.

Preferred dielectric particles that may be used in accordance with the invention are shown in Table 1. It should be understood that Table 1 does not represent an exhaustive list of the dielectric particles and that structural variations e.g. polymorphs, of the particles mentioned in Table 1 are also suitable for use in the invention.

Preferably the dielectric particles have a dielectric constant between 1 and 200.

In a preferred embodiment at least one coating layer comprises a polymeric material as main constituent. Preferably the polymeric material is a thermosetting polymer or a thermoplastic. Suitable polymeric materials include epoxies, polyesters, polyamides, imides, vinyls, acrylics, fluoropolymers, polyurethanes and plastisols.

It is particularly preferred to apply a coating layer as a water based solution to avoid or at least reduce issues associated with handling and the disposal of solvent based solutions. It this therefore preferred that the polymeric materials are water soluble.

In a preferred embodiment at least one coating layer comprises a metal oxide as main constituent. Preferably the metal oxide comprises titania. Advantageously the metal oxide possesses dielectric properties and therefore the selective heating of the layer by microwave radiation is possible, even without dielectric particles being present in the layer.

Dielectric particles may nevertheless be provided in order to tailor the functional properties of the layer, i.e. after heating, and/or to control the penetration depth of the microwave radiation.

In a preferred embodiment the strip comprises aluminium or steel, preferably carbon steel, low carbon steel or electrical steel. Aluminium exhibits very good corrosion protective properties and is formable, making it suitable for a wide variety of applications, particularly construction applications or as a carrier substrate for DSC. Carbon steel is particularly suitable for use in the construction and automotive sectors and is relatively inexpensive to manufacture. The steel may also be an electrical steel making the coated steel suitable for use in transformers. Electrical steel is typically coated with organic and/or inorganic coatings to increase electrical resistance between stacked electrical steel substrates. The applied coatings are also provided to prevent rusting of the electrical steel.

In a preferred embodiment the strip is provided with a metal or metal alloy coating comprising zinc and/or aluminium. Preferably the metal or metal alloy coating is zinc or a zinc alloy. In the case of the zinc alloy it is preferred that the zinc alloy comprises zinc as the main constituent, i.e. the alloy comprises more than 50% zinc, and one or more of Mg, Al, Si, Mn, Cu, Fe and Cr. Zinc alloys selected from the group consisting of Zn—Mg, Zn—Mn, Zn—Fe, Zn—Al, Zn—Cu, Zn—Cr, Zn—Mg—Al and Zn—Mg—Al—Si are preferred and afford additional corrosion protection to the underlying steel substrate. Preferably the zinc or zinc alloy layers are selected from electro zinc (EZ), galvanised (GI), galvannealed (GA), Galvalloy® (zinc with 5% Al) or Galfan® (zinc with about 5% Al) which may be applied by hot-dip galvanising, electro-galvanising, galvannealing or by physical vapour deposition (PVD). Galvalum® which is an alloy containing zinc and aluminium (55%) may also be used. Galvanised steel is particularly suitable for use in organic coated strip applications for the construction and automotive sectors.

In a preferred embodiment there is provided a method for manufacturing a coated strip, which comprises the steps of:
  providing a metal or metal alloy strip;
  providing a polymeric insulating layer on the strip;
  providing a polymeric conductive layer on the insulating layer;
  providing a photoactive layer on the polymeric conductive layer, the photoactive layer comprising a semiconductive metal oxide as main component.

The coated strip thus produced is particularly suitable for use in a DSC having a reverse design. A requirement of current DSC devices is that the polymeric insulating layer and the polymeric conductive layer must not thermally degrade between 350° C. and 600° C., which is the temperature range typically employed to sinter the metal oxide. The present invention removes this requirement because the microwave radiation penetration depth can be tuned to selectively heat and sinter the metal oxide layer without substantially heating the polymeric conductive layer and the polymeric insulating layer. Thus, polymeric materials that could not previously be used, i.e. those that thermally degrade between 350° C. and 600° C., are now suitable for use as insulating layer and conductive layer materials. Moreover, the structural integrity and flexibility of the previously cured insulating layer and conductive layer is preserved. Although not strictly necessary, the metal oxide layer to be sintered may also comprise dielectric particles.

In a preferred embodiment there is provided a method for manufacturing coated strip, which comprises the steps of:
  providing a metal or metal alloy strip;
  providing an organic back coat layer on a first strip surface;
  providing an organic primer layer on a second strip surface;
  providing an organic top-coat layer on the organic primer layer.

Such a coated strip is particularly suitable for use in the construction and automotive sectors as an organic coated strip. Such coated strips have very good corrosion protection properties and a very good aesthetic appearance making them suitable as outer panels for buildings motor vehicles.

Preferably the metal alloy is a galvanised steel strip provided by hot-dip galvanising the steel strip in a bath of molten zinc or zinc alloy. Prior to providing the organic back coat layer and the organic primer layer, a pre-treatment layer may be provided on the galvanised steel strip in order to increase the adhesion between the galvanised coating and the organic primer and/or organic back coat layer. The pre-treatment layer, preferably comprising zirconates and/or phosphates may also be dried using microwave radiation if the pre-treatment layer comprises dielectric particles, although conventional heating means may also be used.

The primary purpose of the organic primer layer is to improve the corrosion protective properties of the organic coated strip. Suitable organic primer layer materials include polyesters, polyimides, preferably polyetherimides, epoxies or oil alkyds. While the organic primer layer provides corrosion protection, the top-coat layer is provided to improve the aesthetic appearance of the finished organic coated strip. It is preferred that the organic top coat layer comprises plastisol, polyester, polyurethane or polyfluorocarbons.

In a preferred embodiment one or more layers are applied by coil coating. This has the advantage that smooth uniform coatings can be obtained. Due to the controlled manner in which coatings are applied, the coil coating also leads to coatings having improved corrosion resistance properties and aesthetic appearance.

A second aspect of the invention relates to the coated strip produced according to the method of the first aspect of the invention.

Embodiments of the present invention will now be described by way of example. These examples are intended to enable those skilled in the art to practice the invention and do not in anyway limit the scope of the invention as defined by the claims.

According to an example an insulating layer of polyamide is applied on a carbon steel strip and subsequently cured at a temperature of 230° C. using near infrared radiation having a wavelength in the range of 800 to 1000 nm and having a peak intensity in the range of 910 to 930 nm. The NIR is provided by a NIR source such as Adphos lamps. A conductive layer comprising a polyamide binder, carbon nanotubes and graphite particles was then applied on the cured insulating layer. In order to dry and subsequently cure the conductive layer, the conductive layer was irradiated with microwave radiation having a frequency of 2.45 Hz. The microwave source was a modified microwave oven (Carbolite, MRF-16/22 Microwave assisted technology furnace) capable of producing a tuneable continuous power output up to a maximum of 1200 W. The microwave power was increased from 70% at a rate of 5%/s until the curing temperature (330° C.) was reached. A paste (DSL 18NR-AO) manufactured by Dyesol comprising an ethyl cellulose binder, terpineol and anatase titania particles having a particle diameter between 350 and 450 nm was then applied on the cured conductive layer using a bar coater. The Titania paste was then irradiated with microwave radiation (2.45 Hz) with the power being increased from 0% to 100% at a rate of 5%/s until the water and the binder were removed and the sintering temperature was reached.

Figure 1B:
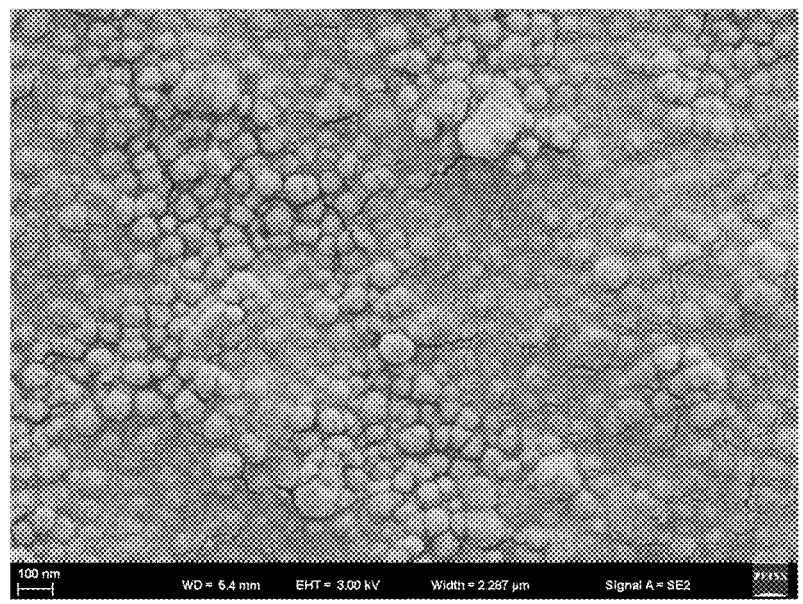

FIG. 1 shows two scanning electron microscope (SEM) images of sintered titania surfaces. SEM images were obtained using a Philips XL30, Scanning Electron Microscope. FIG. 1A shows a sintered titania surface obtained by irradiating the multi-layer coating with microwave radiation, whereas FIG. 1B shows a sintered titania surface obtained by subjecting the coated steel strip to a heat treatment of 550° C. in a convection oven.

The use of microwave radiation to heat the titania layer results in a sintered titania surface having an increased concentration of titania in the anatase form relative to the sintered titania surfaces obtained by conventional heating means. Moreover, titania that is sintered by microwave radiation exhibits improved crystallinity (see FIG. 1A) relative to titania that is sintered in a convection oven (see FIG. 1B). This has the benefit that the rate of electron transfer from the light absorbing dye into the conduction band of the metal oxide is increased, with the expectation of increasing the overall efficiency of the photovoltaic cell.

The inventors also found that the amount of iron detectable at the coated steel surface is minimal. This suggests that the structural integrity of the titania layer, the conductive layer and the insulating layer is maintained, whereas the same layers thermally degrade to a much greater extent when conventional heating means are used to sinter the titania layer. These advantages have been attributed to the lower processing temperatures that are required to sinter the titania layer when using microwave radiation, which maintains the nanostructure of the titania layer and limits grain growth.

In another example a magnesium oxide (MgO) slurry was prepared by adding $TiO_2$ (6.12 g), Borax (0.12 g) and water (800 ml) to a mixing vessel and stirring this mixture for 10 minutes at 6° C. MgO powder (122.37 g) and 3 wt % of iron oxide dielectric particles ($Fe_2O_3$) was then added to the mixture and this mixture was stirred for a further 15 minutes before being applied onto a grain oriented steel panel (210 mm×297 mm) by draw bar coating. As a control, a second MgO coated GO steel was prepared in the same way except that the iron oxide particles were omitted from the slurry. In a further example a MgO slurry containing 1 wt % of iron oxide dielectric particles was prepared in the same way.

A temperature probe (OPTOCON TSNANO) was provided on the MgO coated surface with iron oxides particles and on the MgO coated surface without oxide particles in order to measure the temperature of the respective surfaces when exposed to microwaves. High temperature tape (FT1 172, Flashtape 1, Cytec) was used to secure the temperature probes to the respective surfaces. The temperature of the surfaces was determined by a FOTEMP 4-16" fibre optic temperature monitoring data logging system and by using OPTOCON's software FOTEMP assistant.

The coated panels were then placed on a steel bench and Insulating tape was used to cover the bench in order to insulate the steel panel from the bench. A single point of contact was kept between the steel panel and the bench to allow electrical current to flow freely, thus minimising the resistive heating effect in the steel panel, and to prevent arcing. The bench was subsequently provided in a microwave chamber (Votsch Hephaistos microwave oven 100/100, capable of providing a continuous power output of up to 960 W) and a fixed microwave frequency of 2.45 GHz was used to irradiate the panels. At the end of each test, the microwave oven door was opened and a thermal picture was taken using a Ti 25 Fluke thermal imaging camera in order to confirm the temperature of the coated and uncoated surfaces of the steel panel.

Figure 2:
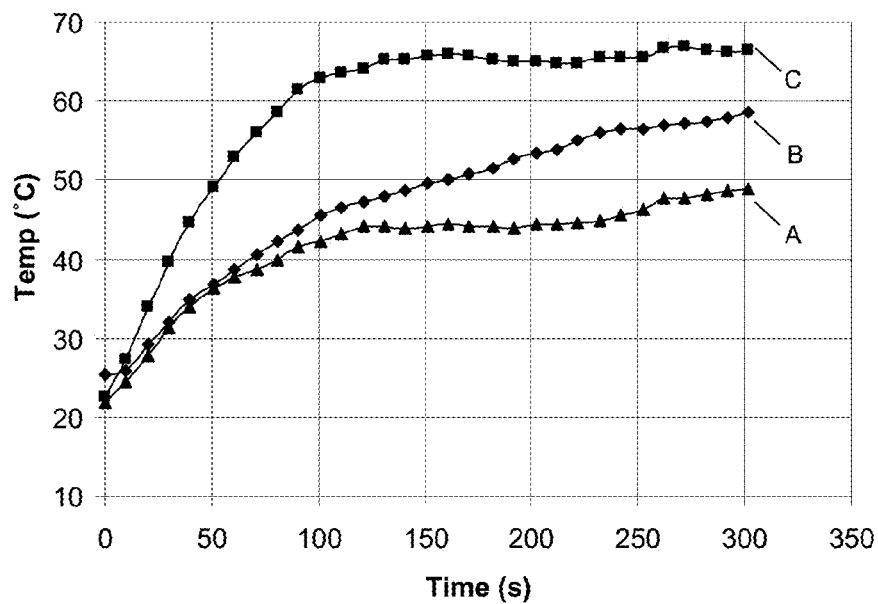

The MgO coated steel panels were irradiated for 5 minutes at a microwave power of 50%. FIG. 2 shows that the peak temperature of the MgO coating with 3 wt % of iron oxide particles (C) (66 ° C.) is greater than the peak temperature of the MgO coating without iron oxide particles (A) (48° C.). The difference in peak temperature (18° C.) has been attributed to the iron oxide particles in the MgO coating absorbing a large proportion of the emitted MW radiation, whereas less MW radiation is absorbed by the MgO coating without the iron oxide particles. Since the MgO coating containing the iron oxide particles absorbs a large proportion of the MW radiation, less MW radiation reaches the steel panel and therefore the problems associated with microwave reflection are avoided or at least reduced. Similarly, the MgO coating containing iron oxide particles will shield any previously applied coating from the MW radiation since the MW radiation will be absorbed by the iron oxide particles and not (at least to a large extent) by the previously applied coating. Thus, the MgO coating containing the iron oxide particles is selectively heated and the mechanical properties of the previously applied coating are preserved.

The measured peak temperature for the MgO coating with 1 wt % of iron oxide particles (B) was 58° C., a peak temperature difference of 8° C. with respect to the MgO coating containing 3 wt % of iron oxide particles (C).

FIG. 2 also shows that the rate of heating, especially in the initial stages of heating, is faster for MgO coatings that contain iron oxide particles relative to MgO coatings where iron oxide dielectric particles are absent. It also shows that the rate of heating is faster for the MgO coating containing 3 wt % of iron oxide particles (C) compared to the rate of heating for the MgO coating that contained 1 wt % of iron oxide particles (B). In another example a phosphate coating composition was prepared by charging a mixing vessel with 266 ml aluminium orthophosphate and 470 ml colloidal silica (30%). This mixture was then stirred using a magnetic stirrer for 30 seconds before 64 ml of tap water was added to the mixing vessel. This mixture was stirred for a further 20 minutes. Before the mixture was applied to the GO steel panel (210 mm×297 mm), the panel was cleaned by submerging the panel in boiling 20% w/v NaOH for 10 mins, removing the panel and submerging it in water and then drying the panel in air.

The phosphate coated steel panels were irradiated for 5 minutes at a microwave power of 50% using a Votsch Hephaistos microwave oven 100/100 . The peak metal temperature of the phosphate coating comprising aluminium phosphate particles was 100° C., whereas the peak metal temperature of the steel panel was 58° C., a peak temperature difference of 42° C. This result indicates that the phosphate coating is heated in preference to the GO steel panel and that it can be used to shield the steel panel and/or any previously applied coating layer from the MW radiation.

The surface morphology of the phosphate coated steel panels was determined using a FEI Quanta 600 FEG-SEM.

Figure 3A:
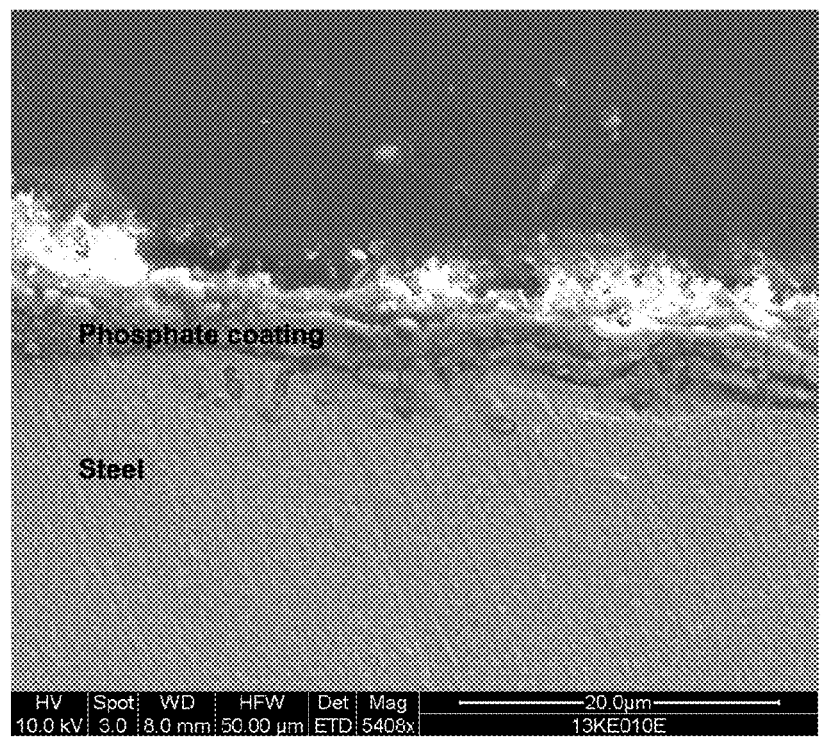
Figure 3B:
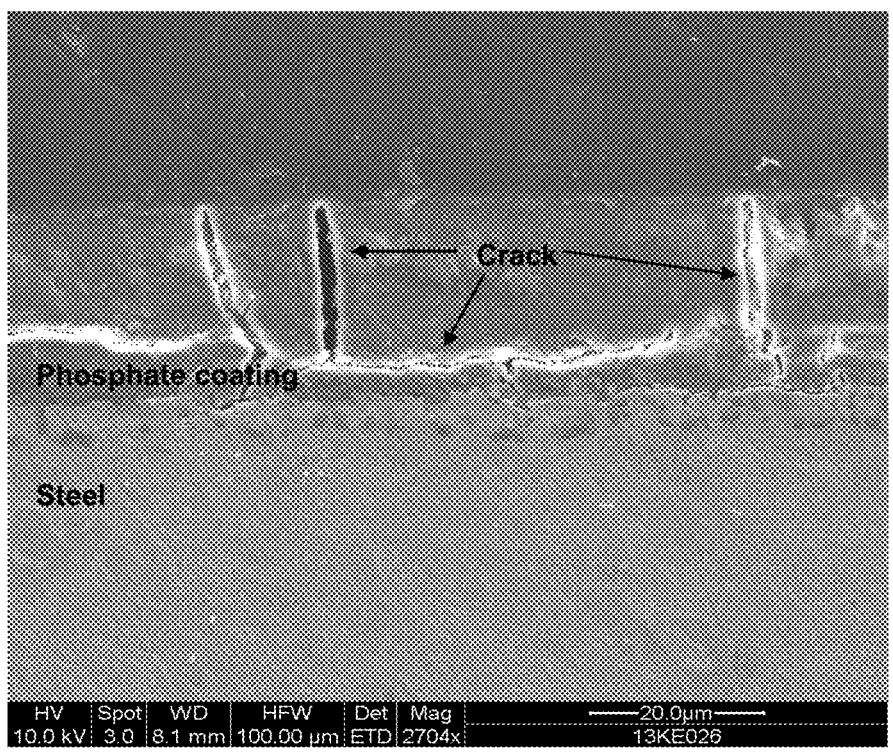

FIG. 3A shows an SEM image of a phosphate coating that was cured using MW radiation (5 min, 50% power), whereas FIG. 3B shows an SEM image of a phosphate coating that was cured in a convection oven using hot-air (1 min, 100° C.). Comparison of the SEM images shows that many more cracks are present in the hot-air cured phosphate coating layer (3B) relative to the number of cracks present in the phosphate coating that was cured using MW radiation (3A).

TABLE 1

| Dielectric Particles | |
| --- | --- |
| Aluminum Fluoride | Silver Chloride |
| Vanadium Tetrachloride (78° F.) | Barium Chloride |
| Vanadium Sulfide | Magnesium Oxide |
| Antimony Pentachloride (68° F.) | Cupric Sulfate |
| Vanadium Oxychloride (78° F.) | Ethylene Chloride (68° F.) |
| Vanadium Oxybromide (78° F.) | Selenium |
| Silicon Dioxide | Tetrahydro-B-Napthol (68° F.) |
| Maganese Dioxide | Propyl Chloroformate (68° F.) |
| Anitmony Trichloride | Silver Chloride |
| Methyl Butyrate (68° F.) | Barium Sulfate (60° F.) |
| Silver Cyanide | Calcium Oxide, Granule |
| Sodium Chloride | Graphite |
| Aluminum Phosphate | Silver Bromide |
| Sodium Chloride (Salt) | Arsenic Trichloride (70° F.) |
| Forsterite | Dipropyl Ketone (62° F.) |
| Methyl Benzoate (68° F.) | Methyl Chloride (77° F.) |
| Benzal Chloride (68° F.) | Methyl Chloroacetate (68° F.) |
| Ammonium Chloride | Benzophenone (68° F.) |
| Mica | Ferrous Oxide (60° F.) |
| Ammonium Bromide | Ferrous Sulfate (58° F.) |
| Aniline (68° F.) | Lead Sulfate |
| Calcim Fluoride | Diethyl Sulfite (68° F.) |
| Sodium Cyanide | Benzaldehyde (68° F.) |
| Magnesium Sulfate | Copper Oxide |
| Methyl Salicylate (68° F.) | Cupric Oxide (60° F.) |
| Alumina | Lead Carbonate (60° F.) |
| Barium Chloride | Benzyl Cyanide (68° F.) |
| Magnesium Oxide | Benzoyl Chloride (70° F.) |
| Cupric Sulfate | M-Nitrotoluene (68° F.) |
| Ethylene Chloride (68° F.) | Benzonitrile (68° F.) |
| Selenium | Benzoylacetone (68° F.) |
| Tetrahydro-B-Napthol (68° F.) | Water (68° F.) |
| Propyl Chloroformate (68° F.) | Titanium Dioxide |

The invention claimed is:

1. A method for providing a coated strip, which comprises the steps of providing a metal or metal alloy strip
   applying two or more coating layers on the metal or metal alloy strip by coil coating, and
   irradiating one or more of the applied coating layers with electromagnetic microwave radiation,
   wherein each said one or more of the applied coating layers being irradiated comprises at least 1 wt % of dielectric particles capable of absorbing the microwave radiation and wherein the microwave radiation has a fixed microwave frequency between 0.9 GHz and 7.0 GHz to selectively heat at least the second coating layer of the coating layers containing the dielectric particles to cure and/or sinter the second coating layer,
   wherein a first said coating layer applied adjacent to the metal or metal alloy strip is dried and/or cured in a convection oven or by using infrared, near infrared or ultraviolet radiation and a second coating layer applied on the dried and/or cured first coating layer is cured or sintered by the irradiating using the microwave radiation without substantially heating the first coating layer.

2. The method according to claim 1, wherein at least two layers of the two or more layers comprise the dielectric particles.

3. The method according claim 2, wherein the second coating layer has said dielectric particles and is heated by irradiation with microwave radiation and then an additional said coating layer comprising dielectric particles is provided on the cured or sintered second coating layer and selectively heated by irradiating the additional layer with microwave radiation without substantially heating the second coating layer.

4. The method according to claim 1, wherein each irradiated coating layer contains at least 5 wt % of the dielectric particles.

5. The method according to claim 1, wherein the first coating layer adjacent to the metal or metal alloy strip is dried and/or cured in a convection oven or by using infrared, near infrared or ultraviolet radiation and every additional said coating layer comprises said dielectric particles and is heated by being irradiated with said microwave radiation, wherein each additional said coating layer is applied on a previously applied said coating layer and is selectively cured or sintered using microwave radiation before application of a subsequent said coating layer, wherein three to seven coating layers are applied.

6. The method according to claim 1, wherein the dielectric particles comprise, carbon black, graphite, carbon nanotubes, iron oxide, zinc oxide, titania, silica or a mixture thereof.

7. The method according to claim 1, wherein at least one coating layer comprises a polymeric material as main constituent.

8. The method according to claim 1, wherein at least one coating layer comprises a metal oxide as main constituent.

9. The method according to claim 1, wherein applying one or more coating layers on the metal or metal alloy strip comprises:
   providing a polymeric insulating layer on the strip;
   providing a polymeric conductive layer on the insulating layer.

10. The method according to claim 1, wherein the metal or metal alloy strip is provided with a metal or metal alloy coating comprising zinc and/or aluminium.

11. The method according to claim 1, wherein the coating layer contains between 5 and 80 wt % of the dielectric particles.

12. The method according to claim 1, wherein the coating layer contains between 5 and 30 wt % of the dielectric particles.

13. The method according to claim 1, wherein the coating layer contains between 10 and 15 wt % of the dielectric particles.

14. The method according to claim 1, wherein the metal or metal alloy strip comprises carbon steel, low carbon steel or electrical steel.

15. A method for providing a coated strip, which comprises the steps of
   providing a metal or metal alloy strip,
   applying one or more coating layers on the metal or metal alloy and
   irradiating one or more of the applied coating layers with electromagnetic radiation, wherein one or more of the applied coating layers comprises at least 1 wt % of dielectric particles capable of absorbing microwave radiation and wherein microwave radiation having a fixed microwave frequency between 0.9 GHz and 7.0 GHz is used to selectively heat one or more of the coating layers containing the dielectric particles to cure and/or sinter the coating layer, wherein applying one or more coating layers on the metal or metal alloy strip comprises:
   providing a polymeric insulating layer on the strip;
   providing a polymeric conductive layer on the insulating layer;
   providing a photoactive layer on the polymeric conductive layer, the photoactive layer comprising a semiconductive metal oxide as main component;

providing a transparent conductive layer on the photoactive active layer.

16. The method according to claim 15, wherein the metal or metal alloy strip comprises aluminium or steel and the one or more coating layers on the metal or metal alloy strip are applied by coil coating.

17. A method for providing a coated strip, which comprises the steps of
providing a metal or metal alloy strip,
applying one or more coating layers on the metal or metal alloy and
irradiating one or more of the applied coating layers with electromagnetic radiation, wherein one or more of the applied coating layers comprises at least 1 wt % of dielectric particles capable of absorbing microwave radiation and wherein microwave radiation having a fixed microwave frequency between 0.9 GHz and 7.0 GHz is used to selectively heat one or more of the coating layers containing the dielectric particles to cure and/or sinter the coating layer, wherein applying one or more coating layers on the metal or metal alloy strip comprises:
providing a metal or metal alloy strip;
providing an organic primer layer on a first strip surface;
providing an organic back coat layer on a second strip surface;
providing an organic top-coat layer on the organic primer layer.

18. The method according to claim 17, wherein the metal or metal alloy strip comprises aluminium or steel and the one or more coating layers on the metal or metal alloy strip are applied by coil coating.

* * * * *